(12) United States Patent
Suh

(10) Patent No.: US 8,319,327 B2
(45) Date of Patent: Nov. 27, 2012

(54) SEMICONDUCTOR PACKAGE WITH STACKED CHIPS AND METHOD FOR MANUFACTURING THE SAME

(75) Inventor: Min Suk Suh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 13/012,921

(22) Filed: Jan. 25, 2011

(65) Prior Publication Data

US 2011/0227217 A1 Sep. 22, 2011

(30) Foreign Application Priority Data

Mar. 18, 2010 (KR) ........................ 10-2010-0024272

(51) Int. Cl.
*H01L 23/02* (2006.01)
(52) U.S. Cl. ......... 257/686; 257/777; 438/107; 438/109
(58) Field of Classification Search .................. 257/686, 257/777, 723, 724; 438/107, 109, 110
See application file for complete search history.

(56) References Cited

U.S. PATENT DOCUMENTS

| | | | | |
|---|---|---|---|---|
| 6,376,904 | B1 * | 4/2002 | Haba et al. | 257/686 |
| 6,621,155 | B1 * | 9/2003 | Perino et al. | 257/686 |
| 7,838,979 | B2 * | 11/2010 | Oh | 257/686 |
| 7,989,943 | B2 * | 8/2011 | Kim et al. | 257/686 |
| 2008/0303131 | A1 | 12/2008 | McElrea et al. | |
| 2009/0230528 | A1 * | 9/2009 | McElrea et al. | 257/676 |

FOREIGN PATENT DOCUMENTS

| | | |
|---|---|---|
| JP | 2009027067 A | 2/2009 |
| JP | 2010034119 A | 2/2010 |
| KR | 1020100002858 A | 1/2010 |

* cited by examiner

*Primary Examiner* — S. V Clark
(74) *Attorney, Agent, or Firm* — William Park & Associates Ltd.

(57) ABSTRACT

A semiconductor package includes at least two semiconductor chips stacked to have step surfaces and possessing bonding pads disposed over the step surfaces. Conductive patterns are disposed over the step surfaces and electrically connect the bonding pads of the semiconductor chips with one another. An insulation member is formed over side and upper surfaces of the stacked semiconductor chips excluding the step surfaces and the conductive patterns.

18 Claims, 13 Drawing Sheets

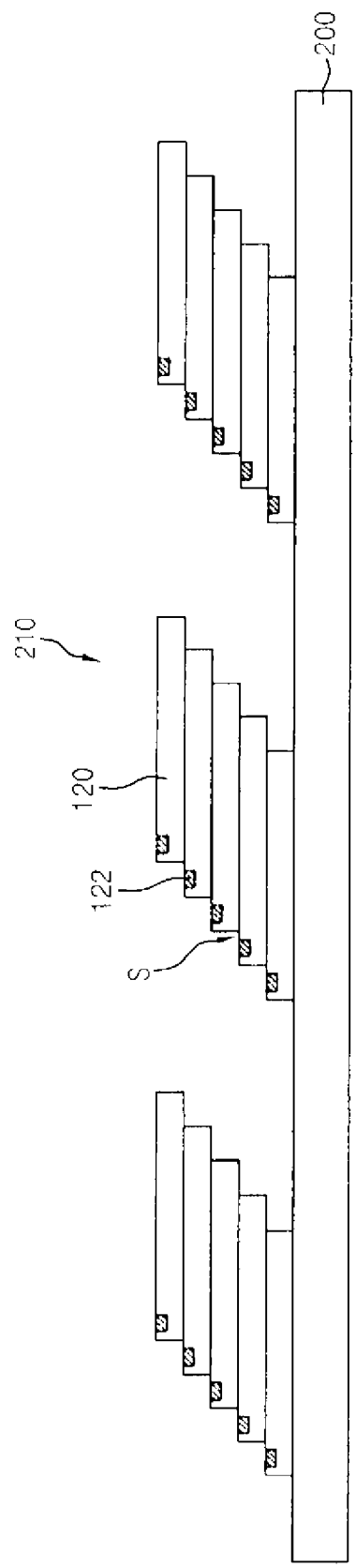

SEMICONDUCTOR PACKAGE WITH STACKED CHIPS AND METHOD FOR MANUFACTURING THE SAME

CROSS-REFERENCE TO RELATED APPLICATIONS

The present application claims priority to Korean patent application number 10-2010-0024272 filed on Mar. 18, 2010, which is incorporated herein by reference in its entirety.

BACKGROUND OF THE INVENTION

The present invention relates to a semiconductor package, and more particularly, to a semiconductor package with stacked chips and a method for manufacturing the same suitable for high speed operation and high degree of integration.

These days, semiconductor chips capable of storing and processing huge amounts of data within extremely short time periods and semiconductor packages having the semiconductor chips have and are further being developed.

Recently proposed, for use in enhancing data storage capacities and for use in increasing data processing speeds, are stack type semiconductor packages in each of which a plurality semiconductor chips are stacked together.

In order to manufacture such stack type semiconductor packages, it is necessary to perform processes for stacking a plurality of semiconductor chips on a substrate and electrically connecting the plurality of stacked semiconductor chips with one another.

However, in the case where the stacked semiconductor chips are electrically connected with one another by the medium of the metal wires, problems are caused in that limitations exist in realizing a fine pitch due to characteristics of wire bonding, and since the plurality of semiconductor chips need to be individually bonded to the substrate, manufacturing slows down.

In particular, in such a stack type semiconductor package, in order to prevent the stacked semiconductor chips and the metal wires from being electrically short-circuited, predetermined spaces should be secured between semiconductor chips. As a consequence, the thickness of the semiconductor package increases.

BRIEF SUMMARY OF THE INVENTION

An embodiment of the present invention is directed to a semiconductor package with stacked chips and a method for manufacturing the same suitable for high speed operation and high degree of integration.

In one embodiment of the present invention, a semiconductor package includes at least two semiconductor chips stacked to have step surfaces and possessing bonding pads disposed over the step surfaces. Conductive patterns may be disposed over the step surfaces to electrically connect corresponding bonding pads of the semiconductor chips with one another. Insulation member is formed over side and upper surfaces of the stacked semiconductor chips excluding the step surfaces and the conductive patterns.

Each of the conductive patterns may include a first conductive part formed over the step surfaces, a second conductive part extending past the first conductive part formed over a semiconductor chip positioned lowermost among the stacked semiconductor chips, and a third conductive part extending vertically upward from the second conductive part at least to a height corresponding to an upper surface of a semiconductor chip positioned uppermost among the stacked semiconductor chips.

The semiconductor package may further include connection members attached to lower surfaces of second conductive parts or upper ends of third conductive parts.

The connection members may include solders or bumps.

The conductive patterns may be formed to have a constant thickness such that angles formed by adjoining step surfaces are substantially the same with one another.

The conductive patterns may have a thickness that gradually increases from the uppermost semiconductor chip to the lowermost semiconductor chip.

The semiconductor package may further include a filler member formed to cover the step surfaces and the conductive patterns.

The semiconductor package may further include a substrate supporting the insulation member and the stacked semiconductor chips.

The semiconductor package may further include an encapsulation member formed to seal an upper surface of the substrate including the insulation member and the stacked semiconductor chips, and external connection terminals attached to a lower surface of the substrate.

The semiconductor package may further include an underfill member formed between the substrate and the lowermost semiconductor chip.

In another embodiment of the present invention, a method for manufacturing a semiconductor package includes attaching a plurality of semiconductor chip groups, each semiconductor chip group having at least two semiconductor chips stacked such that they have step surfaces and bonding pads are disposed over the step surfaces, to a carrier. An insulation member may be formed over the carrier including the semiconductor chip groups, and recesses may be defined in the areas around the step surfaces and the bonding pads not covered by the insulation member. Conductive patterns may be formed to electrically connect corresponding bonding pads of the semiconductor chips with one another. The carrier may then be removed from the semiconductor chip groups having the conductive patterns and the insulation member and connection members may be formed over the conductive patterns which are exposed due to removal of the carrier. The insulation member may be sawed, or otherwise separated, along scribe lanes between the semiconductor chip groups.

The carrier may include any one of a silicon substrate, a quartz substrate, a glass substrate, and an insulative tape.

Between forming the conductive patterns and removing the carrier, the method may further include forming a filler member in the recesses.

Each of the conductive patterns may include a first conductive part formed over the step surfaces, a second conductive part extending past the first conductive part formed over a semiconductor chip positioned lowermost among the stacked semiconductor chips, and a third conductive part extending vertically upward from the second conductive part at least to a height corresponding to an upper surface of a semiconductor chip positioned uppermost among the stacked semiconductor chips.

The conductive patterns may be formed to have a constant thickness such that angles formed by adjoining step surfaces are substantially the same with one another.

The step of forming the conductive patterns may include forming a metal layer on the insulation layer including the recesses, forming a mask on the metal layer to cover conductive pattern forming regions, removing portions of the metal layer which are exposed out of the mask, and removing the mask.

The conductive patterns may be formed to have a thickness that gradually increases from the uppermost semiconductor chip to the lowermost semiconductor chip.

Between forming the conductive patterns and removing the carrier, the method may further include forming an additional insulation member on the conductive patterns and the insulation member.

BRIEF DESCRIPTION OF THE DRAWINGS

FIGS. 8A through 8E are cross-sectional views sequentially illustrating the processes of the method for manufacturing a semiconductor package in accordance with another embodiment of the present invention.

DESCRIPTION OF SPECIFIC EMBODIMENTS

In the present invention, as an electrical connection path between semiconductor chips is minimized, it is possible to manufacture a semiconductor package which is suitable for a high speed operation. Also, in the present invention, due to the fact that electrical connections between stacked semiconductor chips are formed using plated patterns which are formed through a plating process at a wafer level, the reliability of electrical connections can be improved, and packaging speed of the semiconductor chips can be increased.

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
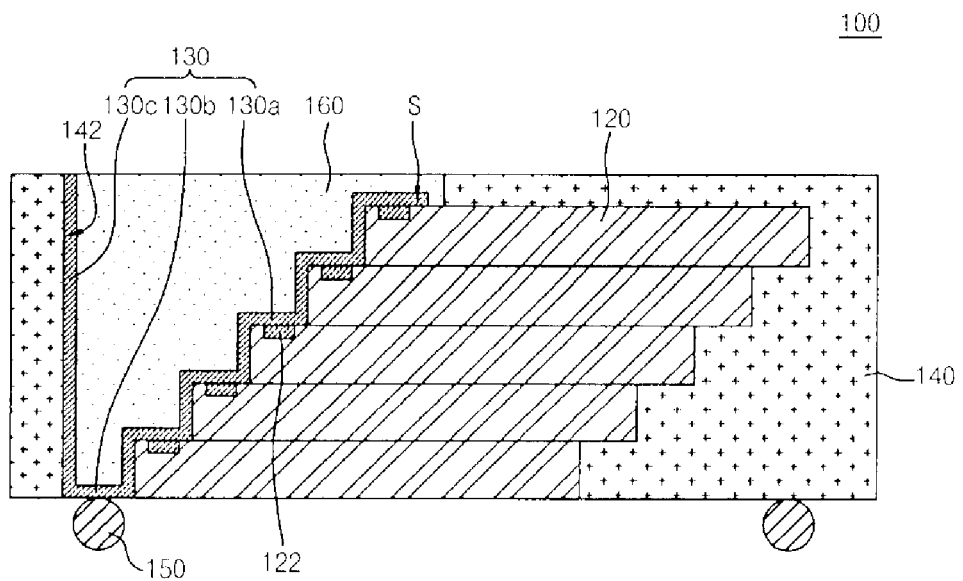
FIG. 1 is a cross-sectional view illustrating a semiconductor package in accordance with an embodiment of the present invention.
Figure 2:
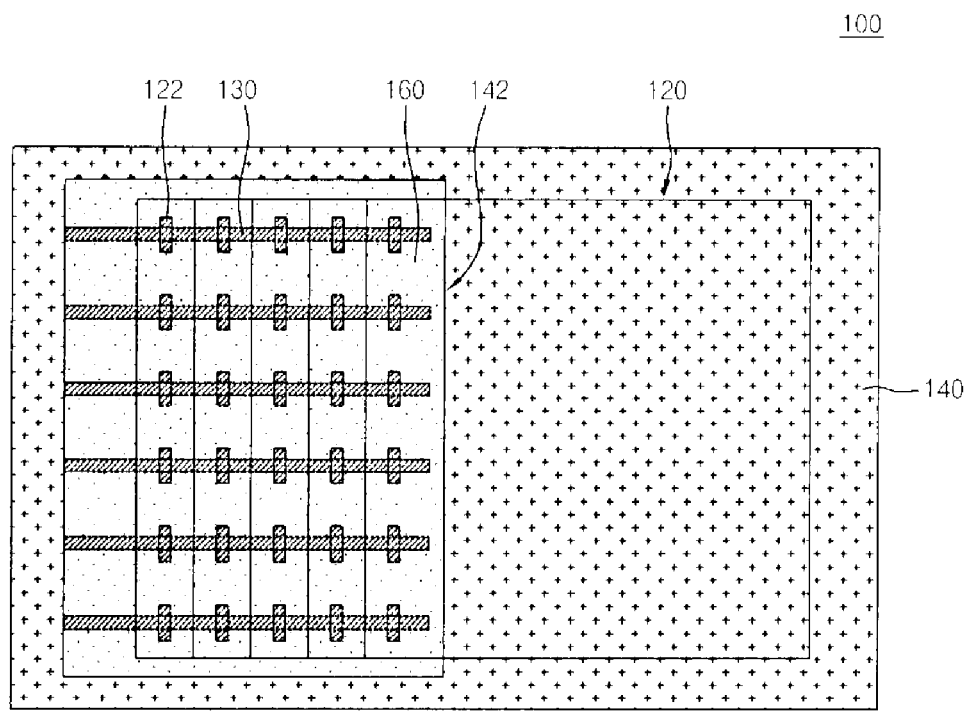
FIG. 2 is a plan view of the semiconductor package shown in FIG. 1.
Figure 3:
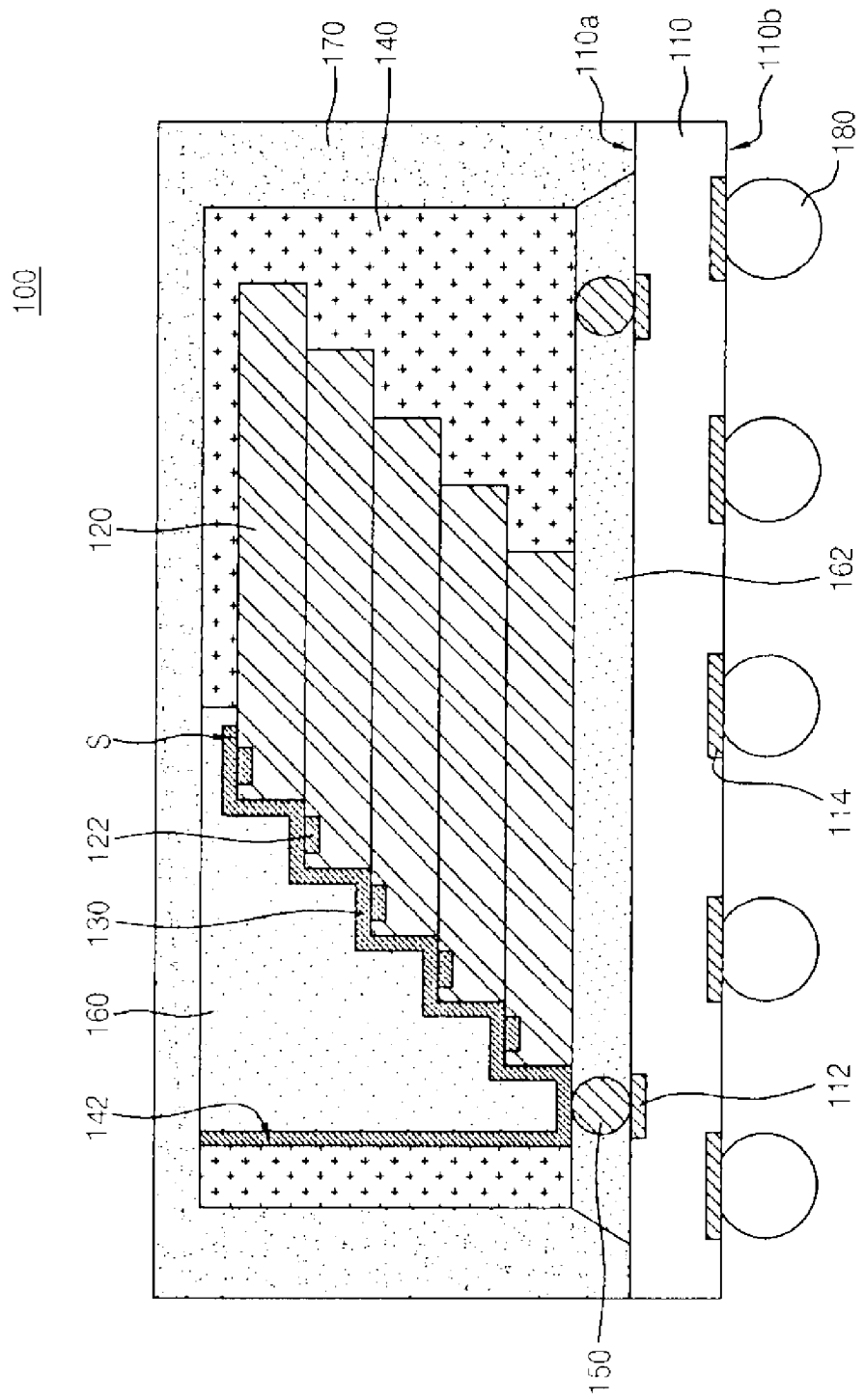
FIG. 3 is a cross-sectional view illustrating the semiconductor package shown in FIG. 1.

FIG. 1 is a cross-sectional view illustrating a semiconductor package in accordance with an embodiment of the present invention, FIG. 2 is a plan view of the semiconductor package shown in FIG. 1, and FIG. 3 is a cross-sectional view illustrating the semiconductor package shown in FIG. 1.

Referring to FIGS. 1 and 2, a semiconductor package 100 in accordance with an embodiment of the present invention includes at least two semiconductor chips 120, conductive patterns 130, an insulation member 140, and connection members 150. In addition, the semiconductor package 100 may further include a filler member 160.

The semiconductor chips 120 are stacked such that they have step surfaces S. Bonding pads 122 are respectively disposed on the step surfaces S. The bonding pads 122 may be disposed adjacent to the edges of the upper surfaces of the respective semiconductor chips 120, or may be disposed along the center portions of the respective semiconductor chips 120. While not shown in a drawing, in the case where the bonding pads 122 are disposed along the center portions of the respective semiconductor chips 120, a redistribution process for redistributing the bonding pads 122 disposed on the center portions to the peripheries of the respective semiconductor chips 120 may be performed.

The conductive patterns 130 are disposed along the step surfaces S of the semiconductor chips 120 and electrically connect the bonding pads 122 with one another. The conductive patterns 130 may be formed by forming a metal layer (not shown) through a plating process using, for example, copper and by selectively etching the metal layer. The conductive patterns 130 may have straight line-like shapes when viewed from the top.

Each of the conductive patterns 130 has a first conductive part 130a which is formed on the step surfaces S, a second conductive part 130b which extends sideward from the first conductive part 130a formed on the semiconductor chip 120 positioned lowermost among the stacked semiconductor chips 120, and a third conductive part 130c which extends vertically upward from the second conductive part 130b at least to a height corresponding to the upper surface of the semiconductor chip 120 positioned uppermost among the stacked semiconductor chips 120. The third conductive part 130c has one end which is connected to the second conductive part 130b and the other end which faces away from the one end. The other end of the third conductive part 130c may be formed to have a height corresponding to the height of the upper surface of the uppermost semiconductor chip 120.

In particular, the conductive patterns 130 may be formed to have a constant thickness such that the angles formed by adjoining step surfaces S are similar. The angles formed by the adjoining step surfaces S may be right angles.

The insulation member 140 is formed to seal the side surfaces of the semiconductor chips 120 and the upper surface of the uppermost semiconductor chip 120, excluding the step surfaces S and the conductive patterns 130. The insulation member 140 may define a recess 142 which expose the step surfaces S and the conductive patterns 130. The insulation member 140 may be formed of insulation materials such as, for example, polyimide, silicon oxide, and/or silicon nitride.

Some of the connection members 150 are attached to the conductive patterns 130 on the lower surfaces of the second conductive parts 130b of the conductive patterns 130. The connection members 150 may include solders or bumps. The connection members 150, which are attached to the lower surfaces of the second conductive parts 130b of the conductive patterns 130, are exposed out of the lowermost semiconductor chip 120. The connection members 150 may also be attached to the lower surface of the insulation member 140 in addition to the second conductive parts 130b. In this case, the connection members 150, which are attached to the lower surface of the insulation member 140, function to horizontally maintain the semiconductor package 100, and have the structures of electrically isolated islands.

The filler member 160 is formed to cover the step surfaces S and the conductive patterns 130. The filler material 160 may be formed to fill the recess 142 and functions to protect the conductive patterns 130 and the stacked semiconductor chips 120 from external shocks and vibrations. The filler member 160 may be omitted as the occasion demands or may be formed of material such as, for example, ACP (anisotropic conductive paste), ACF (anisotropic conductive film), NCF (non-conductive film), and/or NCP (non-conductive paste).

Referring to FIG. 3, the semiconductor package 100 in accordance with the embodiment of the present invention may further include a substrate 110 which supports the stacked semiconductor chips 120. The substrate 110 has circuit wiring lines (not shown) including bond fingers 112 which are formed on an upper surface 110a of the substrate 110 and ball lands 114 which are formed on a lower surface 110b of the substrate 110. The stacked semiconductor chips 120 are attached to the upper surface 110a of the substrate 110 by the medium of an adhesive (not shown).

The substrate 110 and the stacked semiconductor chips 120 are electrically connected with each other due to the fact that the bond fingers 112 of the substrate 110 and the connection members 150 attached to the lower surfaces of the second conductive parts 130b are attached to each other. While not shown in a drawing, the bond fingers 112 and the connection members 150 are electrically connected with each other by the medium of solders.

The semiconductor package 100 in accordance with the embodiment of the present invention may further include an underfill member 162 between the substrate 110 and the lowermost semiconductor chip 120. For example, the underfill member 162 may be the same material as the filler member 160 or may be omitted as the occasion demands.

Moreover, the semiconductor package 100 in accordance with the embodiment of the present invention may further include an encapsulation member 170 formed to seal the upper surface 110a of the substrate 110 including the insulation member 140, the conductive patterns 130, and external connection terminals 180 which are attached to the ball lands 114 disposed on the lower surface 110b of the substrate 110. The encapsulation member 170 may be material such as, for example, an EMC (epoxy molding compound), and the external connection members 180 may include solder balls.

In an embodiment of the present invention, since electrical connections between a substrate and semiconductor chips are formed by the medium of conductive patterns and connection members, electrical signal paths can be shortened, and it is possible to manufacture a semiconductor package suitable for a high speed operation.

Furthermore, in an embodiment of the present invention, unlike the conventional art in which a substrate and semiconductor chips are electrically connected with each other by the medium of metal wires, since the electrical connections between the substrate and the semiconductor chips are formed by the medium of the conductive patterns and the connection members, the reliability of the electrical connections can be improved. In addition, since it is not necessary to secure a predetermined space between the stacked semiconductor chips for wire bonding, the overall thickness of a semiconductor package can be reduced.

Figure 4:
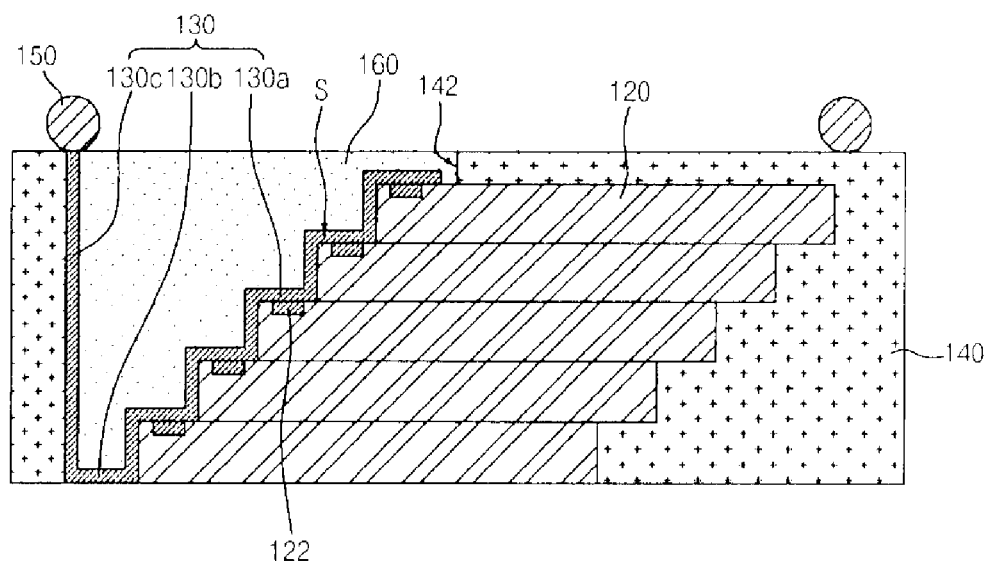
FIG. 4 is a cross-sectional view illustrating a semiconductor package in accordance with another embodiment of the present invention.
Figure 5:
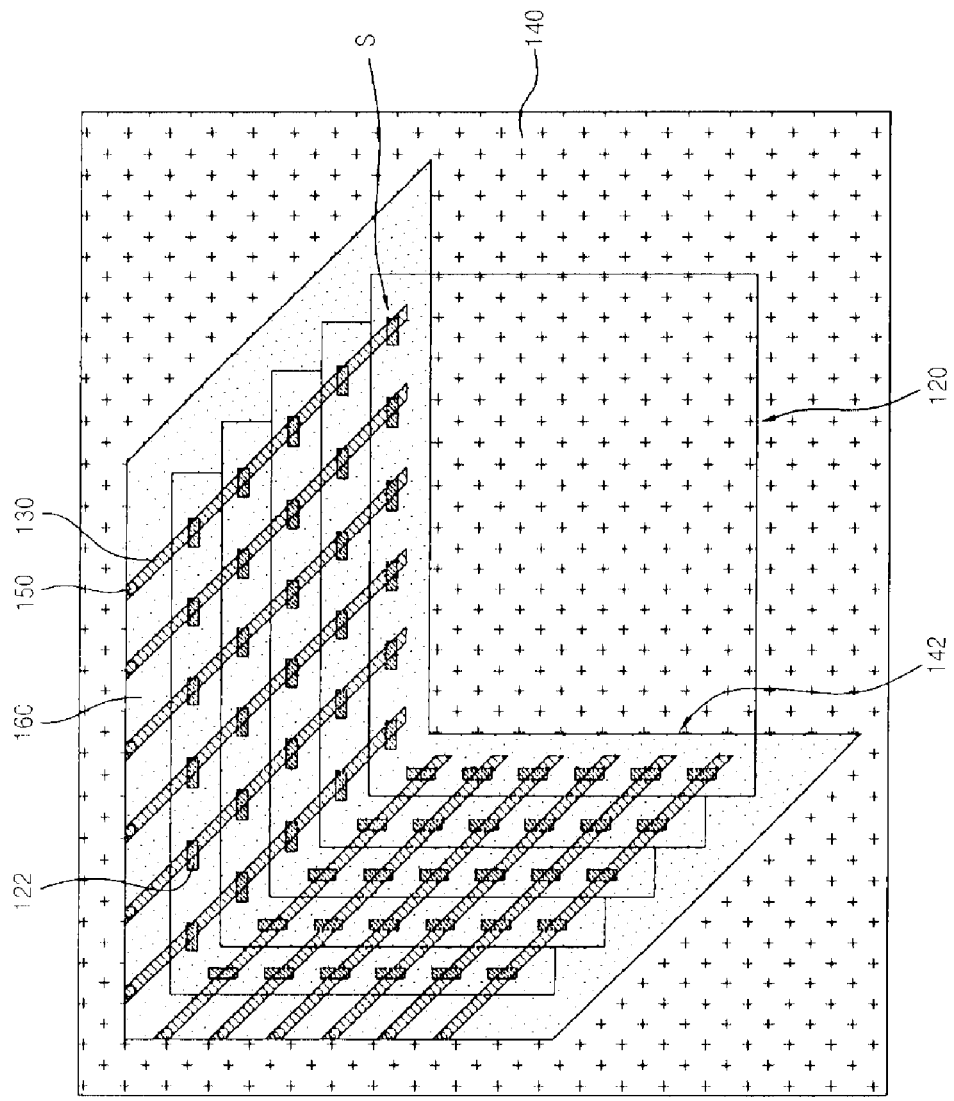
FIG. 5 is a plan view of the semiconductor package shown in FIG. 4.
Figure 6:
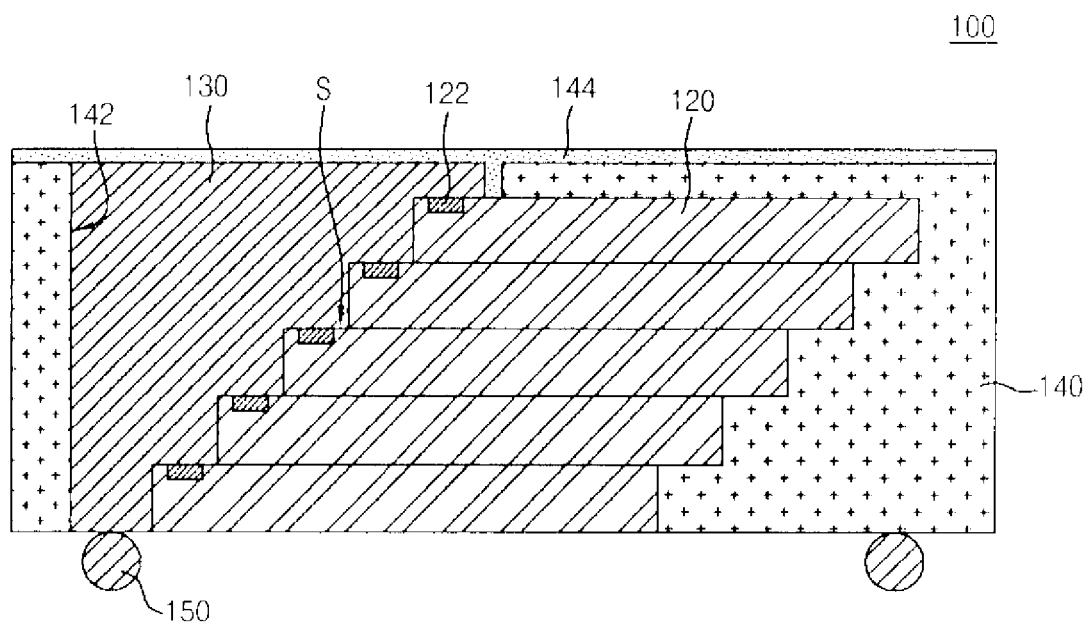
FIG. 6 is a cross-sectional view illustrating a semiconductor package in accordance with another embodiment of the present invention.

FIG. 4 is a cross-sectional view illustrating a semiconductor package in accordance with another embodiment of the present invention, FIG. 5 is a plan view of the semiconductor package shown in FIG. 4, and FIG. 6 is a cross-sectional view illustrating a semiconductor package in accordance with another embodiment of the present invention. In FIGS. 4 through 6, description of a substrate is omitted. The semiconductor packages in accordance with these embodiments of the present invention have substantially the same constructions as the semiconductor package according to the embodiment illustrated in and explained with reference to FIGS. 1 and 2. Therefore, repeated descriptions will be omitted, and only differences will be mainly described below.

Referring to FIGS. 4 and 5, a semiconductor package 100 in accordance with another embodiment of the present invention includes a plurality of semiconductor chips 120, conductive patterns 130, an insulation member 140, and connection members 150. In addition, the semiconductor package 100 may further include a filler member 160.

Because the plurality of semiconductor chips 120 and the insulation member 140 have the same constructions as those of the embodiment described above with reference to FIGS. 1 and 2, repeated descriptions thereof will be omitted herein.

The conductive patterns 130 are disposed on step surfaces S of the semiconductor chips 120 and electrically connect bonding pads 122 with one another. The conductive patterns 130 may have oblique line-like shapes when viewed from the top. In this case, the semiconductor chips 120 may be stacked in step-like shapes in such a manner that two adjoining surface portions of each semiconductor chip 120 are exposed.

Similar to the aforementioned embodiment, each of the conductive patterns 130 has a first conductive part 130a, a second conductive part 130b, and a third conductive part 130c. The present embodiment of the invention is distinguished from the aforementioned embodiment in that the connection members 150 are attached to the upper ends of the third conductive parts 130c. The connection members 150 may be disposed on the same plane as the upper surface of the semiconductor chip 120 positioned uppermost among the semiconductor chips 120 and may be exposed to an outside.

Meanwhile, referring to FIG. 6, in another embodiment of the present invention, each of conductive patterns 130 may be formed to have a thickness that gradually increases from an uppermost semiconductor chip 120 to a lowermost semiconductor chip 120. In this construction, the reliability of electrical connections between the conductive patterns 130 and respective bonding pads 122 may be improved due to the increase in the thickness of the conductive pattern 130.

Further, the semiconductor package 100 in accordance with the embodiment of the present invention shown in FIG. 6 may further include an additional insulation member 144 which is formed on the conductive patterns 130 and the insulation member 140 and protects the conductive patterns 130 from external shocks. The additional insulation member 144 may be formed of the same material as the insulation member 140.

Hereafter, a method for manufacturing a semiconductor package in accordance with another embodiment of the present invention will be described with reference to the accompanying drawings.

Figure 7A:
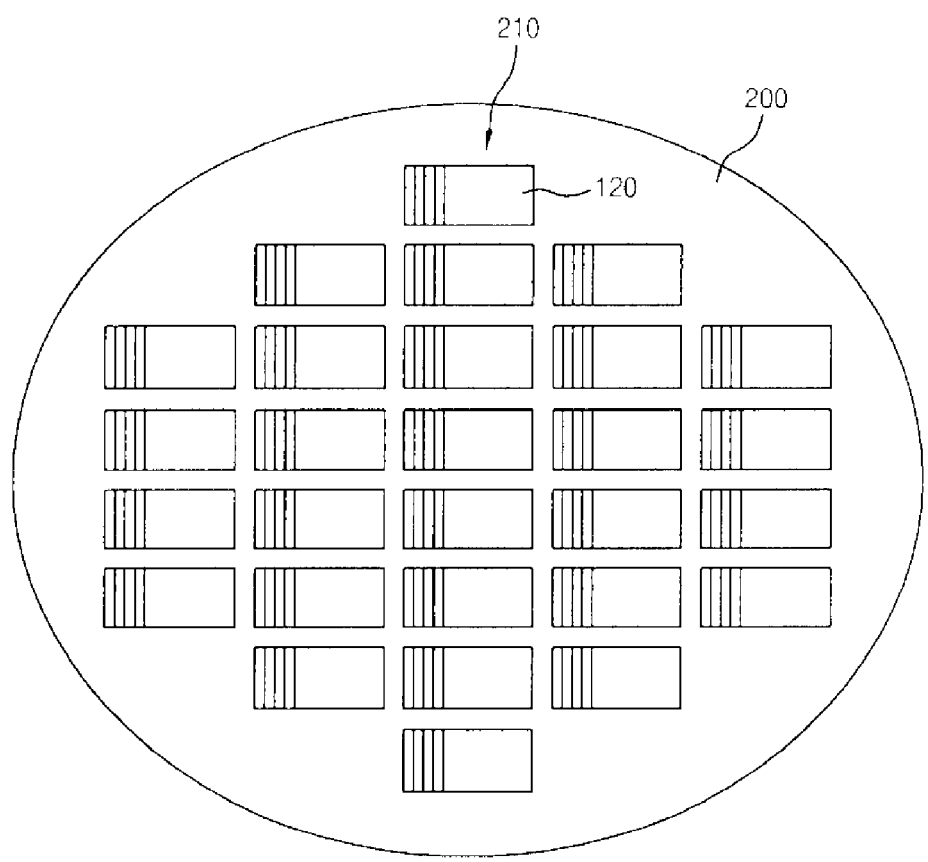
FIGS. 7A through 7C are plan views sequentially illustrating the processes of a method for manufacturing a semiconductor package in accordance with another embodiment of the present invention.
Figure 7B:
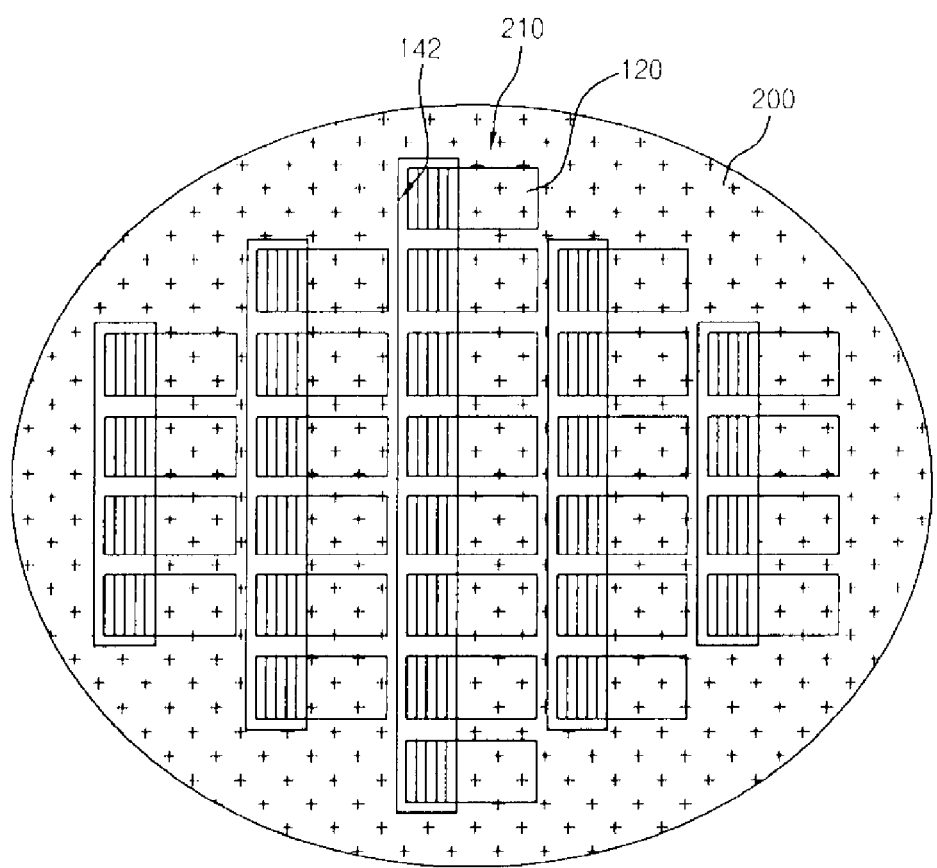
Figure 7C:
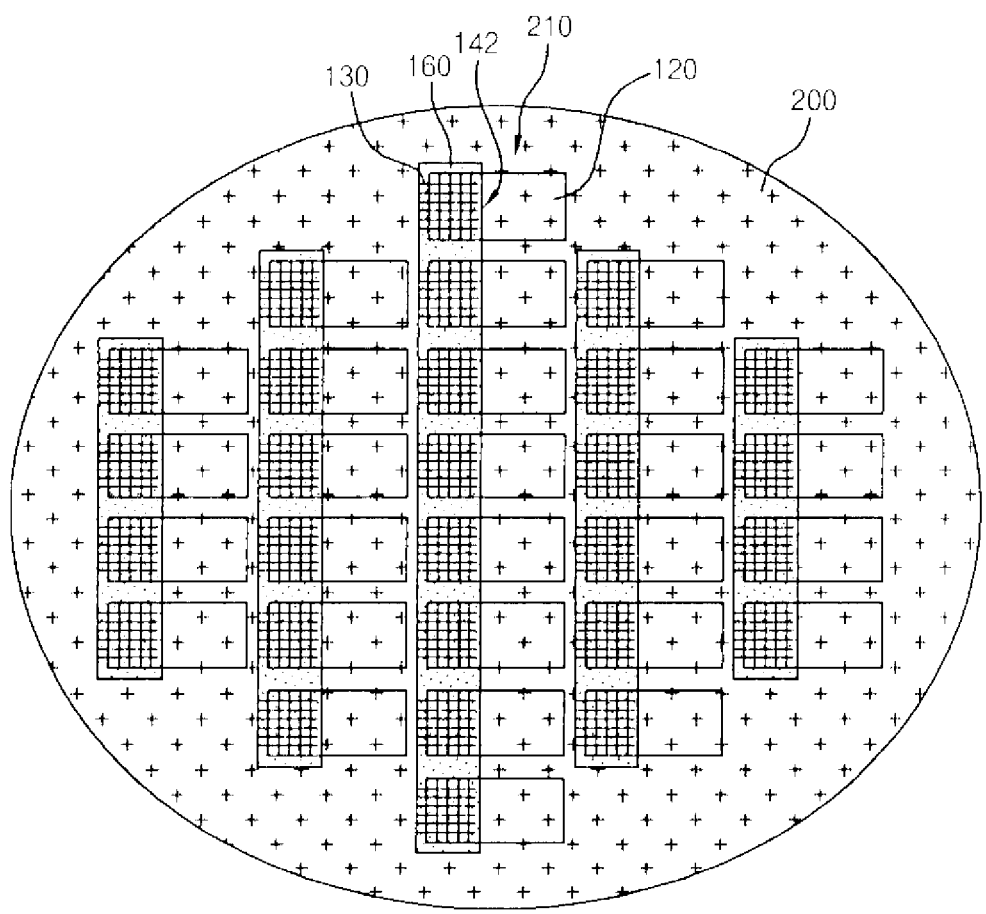

FIGS. 7A through 7C are plan views sequentially illustrating the processes of a method for manufacturing a semiconductor package in accordance with another embodiment of the present invention, and FIGS. 8A through 8E are cross-sectional views sequentially illustrating the processes of the method for manufacturing a semiconductor package in accordance with another embodiment of the present invention.

Referring to FIGS. 7A and 8A, a plurality of semiconductor chip groups 210, each having at least two semiconductor chips 120 which are stacked such that they have step surfaces S and bonding pads 122 are disposed on the respective step surfaces S, are attached to a carrier 200.

Therefore, each semiconductor chip group 210 has at least two semiconductor chips 120 and the bonding pads 122 (shown in FIG. 8A) which are disposed on the upper surfaces of the semiconductor chips 120. The semiconductor chip groups 210 may be attached in a coplanar type in which the semiconductor chip groups 210 are separated in parallel on the same plane of the carrier 200. The carrier 200 may comprise material such as, for example, silicon substrate, quartz substrate, glass substrate, or insulative tape.

Figure 8B:
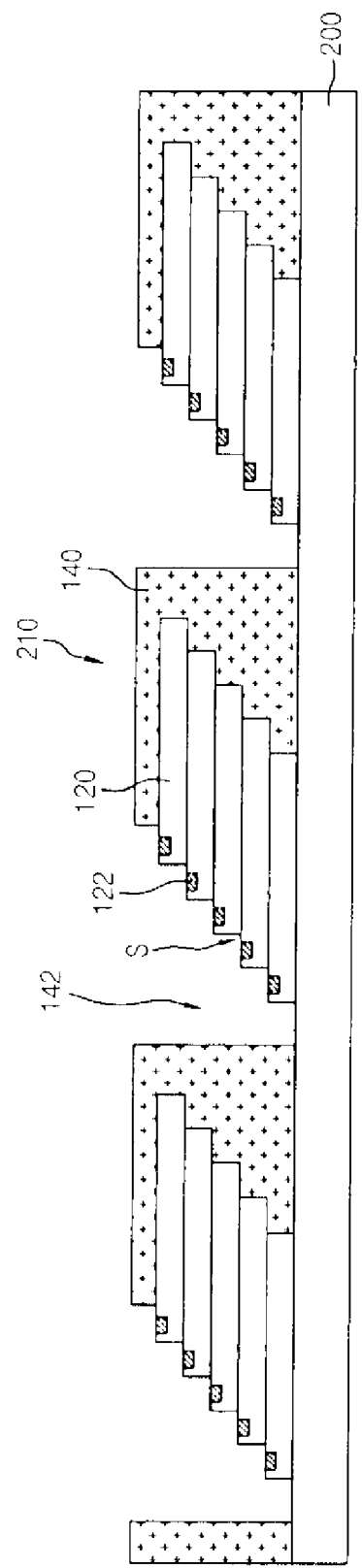

Referring to FIGS. 7B and 8B, an insulation member 140 (shown in FIG. 8B) is formed in such a way as to cover the upper surface of the carrier 200 including the semiconductor chip groups 210. The insulation member 140 may be formed to seal the side surfaces and the upper surfaces of the semiconductor chips 120 of the respective semiconductor chip groups 210. The insulation member 140 may be material such as, for example, polyimide, silicon oxide, or silicon nitride.

By selectively removing the insulation member 140, recesses 142 are defined in such a way as to expose the step surfaces S (shown in FIG. 8B) and the bonding pads 122 (shown in FIG. 8B).

Figure 8C:
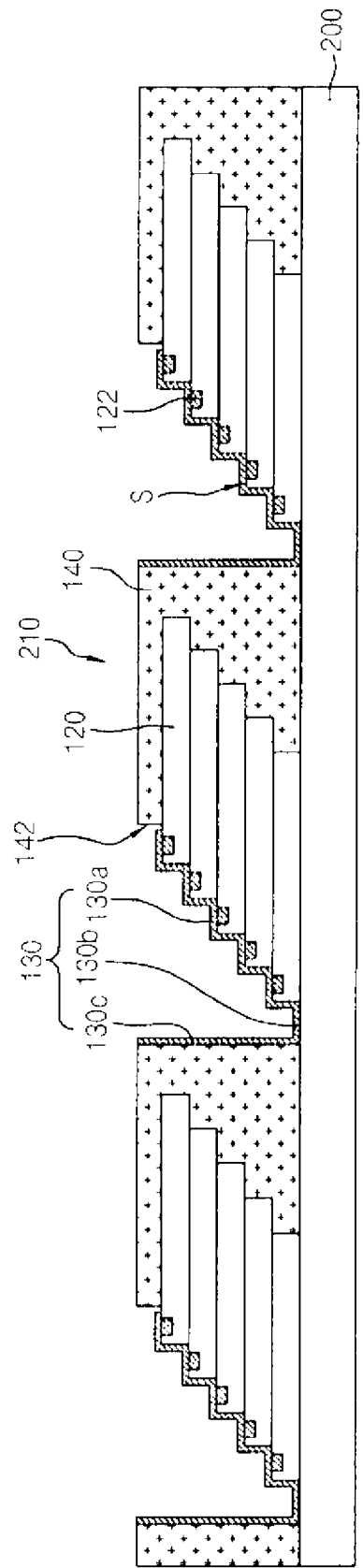

Referring to FIGS. 7C and 8C, conductive patterns 130, which electrically connect the bonding pads 122 (shown in FIG. 8C) of the semiconductor chips 120, are formed. While the process is not shown in a drawing, the conductive patterns 130 may be formed by forming a metal layer (not shown) on the insulation member 140 (shown in FIG. 8C) including the recesses 142, forming a mask (not shown) on the metal layer in such a way as to cover conductive pattern forming regions, removing portions of the metal layer which are exposed out of the mask, and removing the mask which covers the conductive pattern forming regions. The metal layer may be formed, for example, by performing electroplating or electroless plating using material such as, for example, copper.

The conductive patterns 130 are disposed on the step surfaces S (shown in FIG. 8C) of the semiconductor chips 120 and electrically connect the bonding pads 122 (shown in FIG. 8C) with one another. The conductive patterns 130 may have straight line-like shapes when viewed from the top. Unlike this, as shown in FIG. 5, the conductive patterns 130 may have oblique line-like shapes when viewed from the top.

Each of the conductive patterns 130 (as shown in FIG. 8C) has a first conductive part 130*a* which is formed on the step surfaces S, a second conductive part 130*b* which extends sideward from the first conductive part 130*a* formed on the semiconductor chip 120 positioned lowermost among the stacked semiconductor chips 120, and a third conductive part 130*c* which extends vertically upward from the second conductive part 130*b* at least to a height corresponding to the upper surface of the semiconductor chip 120 positioned uppermost among the stacked semiconductor chips 120. The third conductive part 130*c* has one end which is connected to the second conductive part 130*b* and the other end which faces away from the one end. The other end of the third conductive part 130*c* may be formed to have a height corresponding to the height of the upper surface of the uppermost semiconductor chip 120.

The conductive patterns 130 may be formed to have a constant thickness such that the angles formed by adjoining step surfaces S are the same with one another. Unlike this, as shown in FIG. 6, the conductive patterns 130 may be formed to have a thickness that gradually increases from the uppermost semiconductor chip 120 to the lowermost semiconductor chip 120.

Filler members 160 are formed in the recesses 142 which are defined in the insulation member 140 in such a way as to expose the step surfaces S on which the conductive patterns 130 are formed. The filler members 160 are formed to fill the recesses 142 which expose the step surfaces S and the conductive patterns 130, and can protect the semiconductor chip groups 210 including the conductive patterns 130 and the stacked semiconductor chips 120 from external shocks and vibrations. The filler member 160 may be omitted as the occasion demands or may be material such as, for example, ACP (anisotropic conductive paste), ACF (anisotropic conductive film), NCF (non conductive film), or NCP (non conductive paste).

The carrier 200 is removed from the semiconductor chip groups 210 including the filler members 160 and the insulation member 140.

Figure 8D:
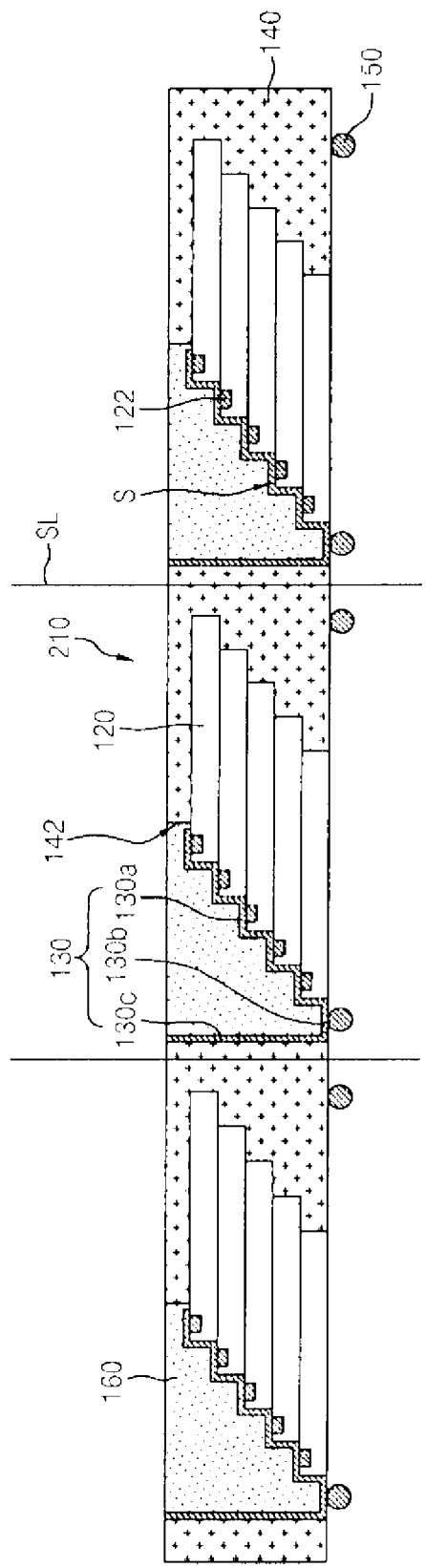

Referring to FIGS. 7C and 8D, connection members 150 (shown in FIG. 8D) are formed on the lower surfaces of the second conductive parts 130*b* or the upper ends of the third conductive parts 130*c* of the conductive patterns 130 which are disposed on the step surfaces S of the semiconductor chip groups 210. The connection members 150 may include solders or bumps. The connection members 150 may also be attached to the lower surface of the insulation member 140 in addition to the second conductive parts 130*b*. The connection members 150, which are attached to the lower surface of the insulation member 140, function to horizontally maintain the semiconductor package groups 210, and have the structures of electrically isolated islands.

Figure 8E:
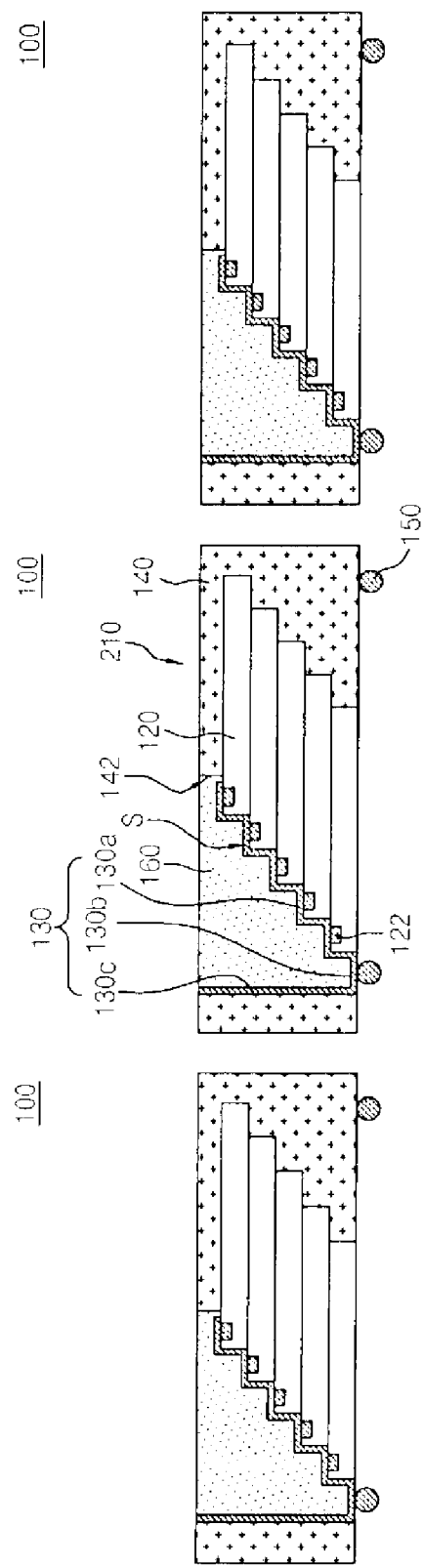

Next, referring to FIG. 8E, the insulation member 140 may be separated, for example, by sawing, along scribe lanes SL (FIG. 8D) between the semiconductor chip groups 210 to individualize a plurality of semiconductor packages 100. In this way, the manufacture of a semiconductor package in accordance with the embodiment of the present invention is completed.

In the manufacture of the semiconductor package, an additional insulation member 144 may be formed on the conductive patterns 130 and the insulation member 140 as shown in FIG. 6, between the step of forming the conductive patterns 130 and the step of removing the carrier 200. The additional insulation member 144 may be formed of the same material as the insulation member 140 or may be omitted as the occasion demands.

As is apparent from the above description, in the embodiments of the present invention, due to the fact that stacked semiconductor chips are electrically connected with one another using conductive patterns which are formed by performing a plating process at a wafer level and a selective etching process, a process can be simplified when compared to a conventional wire bonding process. As a consequence, the semiconductor chips can be packaged more quickly and the reliability of electrical connections can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   at least two semiconductor chips stacked to have step surfaces and possessing bonding pads which are disposed over the step surfaces;
   conductive patterns disposed over the step surfaces and electrically connecting corresponding bonding pads of the semiconductor chips with one another; and
   an insulation member formed over side and upper surfaces of the stacked semiconductor chips excluding the step surfaces and the conductive patterns,
   wherein each of the conductive patterns comprises a first conductive part formed over the step surfaces, a second conductive part extending past the first conductive part formed over a semiconductor chip positioned lowermost among the stacked semiconductor chips, and a third conductive part extending vertically upward from the second conductive part at least to a height corresponding to an upper surface of a semiconductor chip positioned uppermost among the stacked semiconductor chips.

2. The semiconductor package according to claim 1, further comprising:
    connection members attached to lower surfaces of second conductive parts or upper ends of third conductive parts.

3. The semiconductor package according to claim 2, wherein the connection members comprise solders or bumps.

4. The semiconductor package according to claim 1, wherein the conductive patterns have a constant thickness such that angles formed by adjoining step surfaces are substantially the same.

5. The semiconductor package according to claim 1, further comprising:
    a filler member formed to cover the step surfaces and the conductive patterns.

6. The semiconductor package according to claim 1, further comprising:
    a substrate supporting the insulation member and the stacked semiconductor chips.

7. The semiconductor package according to claim 6, further comprising:
    an encapsulation member formed to seal an upper surface of the substrate including the insulation member and the stacked semiconductor chips; and
    external connection terminals attached to a lower surface of the substrate.

8. The semiconductor package according to claim 7, further comprising:
    an underfill member formed between the substrate and the lowermost semiconductor chip.

9. A method for manufacturing a semiconductor package, comprising:
    attaching a plurality of semiconductor chip groups, each semiconductor chip group having at least two semiconductor chips stacked such that they have step surfaces and bonding pads are disposed over the step surfaces, to a carrier;
    forming an insulation member over the carrier including the semiconductor chip groups, wherein
    defining recesses by partially removing the insulation member to expose the step surfaces and the bonding pads;
    forming conductive patterns which electrically connect the corresponding bonding pads of the stacked semiconductor chips with one another;
    removing the carrier from the semiconductor chip groups having the conductive patterns and the insulation member;
    forming connection members over the conductive patterns which are exposed due to removal of the carrier; and
    separating the insulation member along scribe lanes between the semiconductor chip groups.

10. The method according to claim 9, wherein the carrier comprises any one of a silicon substrate, a quartz substrate, a glass substrate, and an insulative tape.

11. The method according to claim 9, wherein, between forming the conductive patterns and removing the carrier, the method further comprises:
    forming a filler member in the recesses.

12. The method according to claim 9, wherein each of the conductive patterns comprises:
    a first conductive part formed over the step surfaces;
    a second conductive part extending past the first conductive part formed over a semiconductor chip positioned lowermost among the stacked semiconductor chips; and
    a third conductive part extending vertically upward from the second conductive part at least to a height corresponding to an upper surface of a semiconductor chip positioned uppermost among the stacked semiconductor chips.

13. The method according to claim 9, wherein the conductive patterns are formed to have a constant thickness such that angles formed by adjoining step surfaces are substantially the same.

14. The method according to claim 9, wherein forming the conductive patterns comprises:
    forming a metal layer on the insulation layer including the recesses;
    forming a mask on the metal layer to cover conductive pattern forming regions;
    removing portions of the metal layer which are exposed out of the mask; and
    removing the mask.

15. The method according to claim 9, wherein the conductive patterns are formed to have a thickness that gradually increases from the uppermost semiconductor chip to the lowermost semiconductor chip.

16. The method according to claim 9, wherein, between forming the conductive patterns and removing the carrier, the method further comprises:
    forming an additional insulation member on the conductive patterns and the insulation member.

17. The method according to claim 9, wherein the separating the insulation member comprises sawing.

18. A semiconductor package comprising:
    at least two semiconductor chips stacked to have step surfaces and possessing bonding pads which are disposed over the step surfaces;
    conductive patterns disposed over the step surfaces and electrically connecting corresponding bonding pads of the semiconductor chips with one another; and
    an insulation member formed over side and upper surfaces of the stacked semiconductor chips excluding the step surfaces and the conductive patterns,
    wherein the conductive patterns have a thickness that gradually increases from the uppermost semiconductor chip to the lowermost semiconductor chip.

* * * * *